United States Patent [19]

McDonald et al.

[11] Patent Number: 4,536,252
[45] Date of Patent: Aug. 20, 1985

[54] LASER-INDUCED PRODUCTION OF NITROSYL FLUORIDE FOR ETCHING OF SEMICONDUCTOR SURFACES

[75] Inventors: Joseph K. McDonald, Athens, Ala.; James A. Merritt, Pulaski, Tenn.

[73] Assignee: The United States of America as represented by the Secretary of the Army, Washington, D.C.

[21] Appl. No.: 699,283

[22] Filed: Feb. 7, 1985

[51] Int. Cl.$^3$ .......................................... H01L 21/265
[52] U.S. Cl. ...................................... 156/662; 156/646; 423/386; 204/157.1 R; 204/157.1 H
[58] Field of Search .................. 204/157.1 R, 157.1 H; 423/386; 156/646, 662

[56] References Cited

U.S. PATENT DOCUMENTS

| | | | |
|---|---|---|---|
| 3,306,834 | 2/1967 | Fox et al. | 204/157.1 R |
| 3,408,276 | 10/1968 | Rey | 204/157.1 R |
| 3,554,699 | 1/1971 | Gross | 423/386 |
| 4,431,477 | 2/1984 | Zajac | 156/646 |
| 4,447,304 | 5/1984 | Malatesta et al. | 204/157.1 R |

OTHER PUBLICATIONS

*Merck Index*, Tenth Edition, p. 953, listing No. 6494.

*Primary Examiner*—Gary P. Straub
*Assistant Examiner*—Jackson Leeds
*Attorney, Agent, or Firm*—Anthony T. Lane; Robert P. Gibson; Jack W. Voigt

[57] ABSTRACT

Nitrosyl fluoride is prepared by laser-induced method wherein the nitrosyl fluoride is produced in situ or in close proximity to where it is used to etch semiconductor surfaces.

A reaction mixture of a catalyst compound and a fluoro compound, wherein the catalyst compound is an oxide of nitrogen selected from the group of nitrogen oxide compounds consisting of NO, $N_2O$, and $NO_2$ and wherein the fluoro compound is selected from the group of fluoro compounds consisting of $NF_3$ and $N_2F_4$, is irradiated with $CO_2$ laser radiation to produce FNO. FNO reacts with an exposed silicon material to produce $SiF_4$ and nitrogen oxide. Since the oxide is regenerated, it can be regarded as a catalyst which can be recovered and recycled.

A production scheme for producing nitrosyl fluoride for etching is disclosed wherein the nitrosyl fluoride is produced directly in the laser reaction chamber by passing a $CO_2$ laser beam through the reaction mixture. Alternately, the nitrosyl fluoride can also be produced in a side chamber and the gas flowed into an etching chamber.

5 Claims, 2 Drawing Figures

LASER-INDUCED PRODUCTION OF NITROSYL FLUORIDE FOR ETCHING OF SEMICONDUCTOR SURFACES

DEDICATORY CLAUSE

The invention described herein may be manufactured, used, and licensed by or for the Government for governmental purposes without the payment to us of any royalties thereon.

BACKGROUND OF THE INVENTION

Many fluorine-containing compounds are used to etch semiconductor materials. Some gaseous mixtures will react spontaneously while others require the use of plasmas, electric discharges or ion beam.

Nitrosyl fluoride (FNO) is an example of a highly reactive fluoronating agent. In the presence of masked silicon wafers it has been shown to react spontaneously to produce silicon tetrafluoride and nitric oxide. However, because of the spontaneously, highly reactive nature of nitrosyl fluoride, storing and handling of the pure compound is extremely hazardous, particularly, in a manufacturing or production environment.

Advantageous would be a procedure for producing nitrosyl fluoride at the time it is used, particularly, if the nitrosyl fluoride is produced from precursors which do not create a storage and handling problem as does the product of reaction.

Even of more significance would be a procedure for making nitrosyl fluoride in situ or in close proximity to where it is used.

Therefore, an object of this invention is to provide a procedure to produce nitrosyl fluoride in situ or in close proximity to where it is used to etch semiconductor surfaces.

Another object of this invention is to provide a laser-induced procedure to produce nitrosyl fluoride in situ or in close proximity to where it is used to etch semiconductor surfaces.

SUMMARY OF THE INVENTION

Irradiation of oxides of nitrogen (NO, $N_2O$, $NO_2$ etc.) or nitrosyl chloride (NOCl) by a cw $CO_2$ tunable laser, in the presence of nitrogen trifluoride ($NF_3$) or tetrafluorohydrazine ($N_2F_4$) produces nitrosyl fluoride in situ.

The in situ production of nitrosyl fluoride in the gaseous state makes it highly desirable for etching silicon chips in accordance with the preferred embodiment disclosed hereinbelow and in the Drawing.

An example of an etching process is comprised of:
(1) Laser irradiation of an NO and $NF_3$ mixture to produce FNO; and
2. FNO reaction with silicon material ($Si_3N_4$, $SiO_2$ or Si surfaces) to produce $SiF_4$ and NO.

Since NO is regenerated, it can be regarded as a catalyst and most of it should be recoverable for recycling. Other nitrogen oxides could be used in place of NO which can also be recycled. The $SiF_4$ can be used for other products or decomposed.

DESCRIPTION OF THE PREFERRED EMBODIMENTS

Laser-induced in situ production of nitrosyl fluoride provides a continuous method for etching semiconductor materials.

Nitrosyl fluoride is produced when a fluoro compound absorbs $CO_2$ laser and subsequently reacts with a nitrogen oxide. Thus, when a mixture of an oxide of nitrogen (NO, $N_2O$, $NO_2$) and a fluoro compound selected from nitrogen trifluoride ($NF_3$) or tetrafluorohydrazine ($N_2F_4$) is irradiated by a $CO_2$ laser, nitrosyl fluoride is produced. Other fluoro compounds that can absorb the $CO_2$ laser could also react with a nitrogen oxide to produce nitrosyl fluoride.

Nitrosyl fluoride reacts spontaneously with masked silicon material to produce silicon tetrafluoride and nitric oxide. Therefore, when nitrosyl fluoride is produced in situ, i.e., within a laser chamber containing the masked silicon material or in an adjoining reaction chamber from which the nitrosyl fluoride is transferred to an etching chamber containing the masked silicon material, etching of semiconductor surfaces is achieved by a cost-effective method, particularly for etching large batches of semiconductor materials as further disclosed hereinbelow.

Using as an example the reaction mixture nitric oxide (NO) and nitrogen trifluoride ($NF_3$), the etching involves the following reaction:
1. Laser irradiation of the NO and $NF_3$ mixture produces FNO.
2. FNO reacts with the silicon wafer to produce $SiF_4$ and NO.

Figure 1:
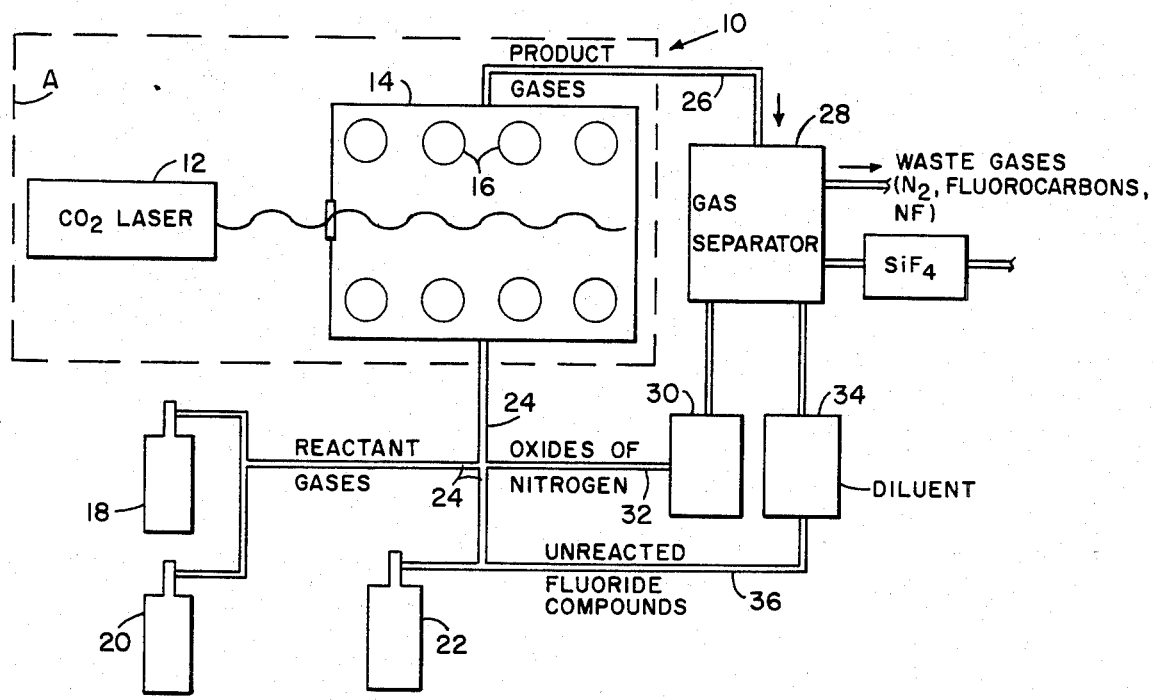
FIG. 1 depicts a laser production method and facilities for producing nitrosyl fluoride in situ to achieve etching of semiconductor surfaces in a combination reaction and etching chamber.

With further reference to the drawings, FIG. 1 depicts a laser-induced production facility of nitrosyl fluoride for etching of semiconductor surfaces. This laser-induced production facility 10 which is outlined within dashed lines A comprises a $CO_2$ laser 12 for inducing a reaction within a combination reaction and etching chamber 14 which contains silicon materials to be etched 16. The associated fixtures comprise a container 18 for containing a fluorine-containing reactant compound (1) ($NF_3$, $N_2F_4$ etc.), a container 20 for containing reactant compound (2) oxides of nitrogen (NO, $N_2O$, $NO_2$, etc.), a container 22 for containing a diluent gas ($N_2$, He, Ar, etc.), and conduit and valve means 24 for introducing gases into reactant chamber 14. Reactant gases in a predetermined ratio with a diluent gas are admitted through conduit means 24 into the reaction and etching chamber 14. Product gases ($SiF_4$ and NO) are removed through conduit means 26 for separation through gas separator 28. Nitric oxide (NO) and unreacted fluoride compounds are recovered and stored in container 30 for recycling through conduit and valve means 32.

Diluent gases are recovered and stored in container 34 for recycling through conduit and value means 36. The diluent gas storage containers can also furnish gases for purging the reactant chamber, gas separator, and conduit systems.

Figure 2:
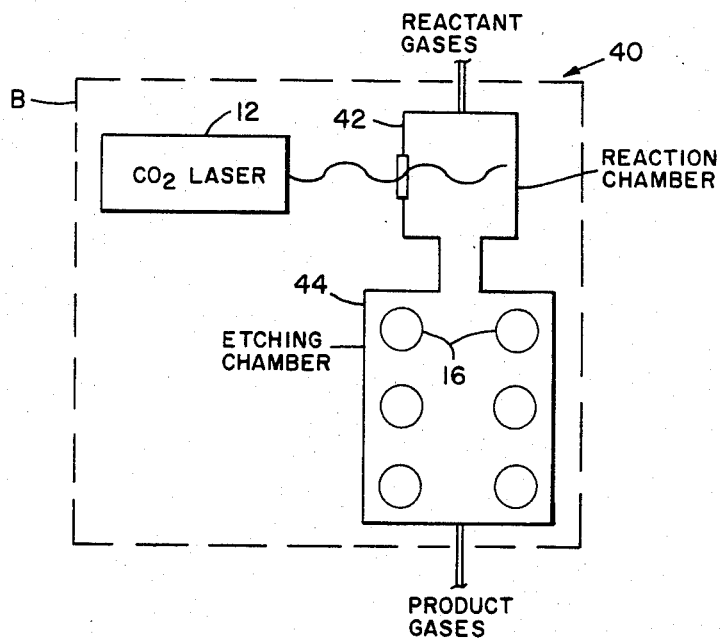
FIG. 2 depicts a laser production method and facilities for producing nitrosyl fluoride in a side reaction chamber and subsequently flowing same into an etching chamber to achieve etching of semiconductor surfaces.

Another embodiment is depicted in FIG. 2 wherein a laser-induced production facility 40 is outlined by dashed lines B. The nitrosyl fluoride for etching semiconductor surfaces is produced in a side reaction chamber 42 and flowed into etching chamber 44. The associated fixtures as depicted in FIG. 1 having like numbers as shown in FIG. 1 perform the same functions in embodiment of FIG. 2 as FIG. 1 except as required to form nitrosyl fluoride in a side reaction chamber.

Additional description of the CW $CO_2$ laser reaction cell, $CO_2$ Spectrum Analyzer, and other details of the experiments of this invention are set forth below.

The laser induced chemical reactions are initiated by an infrared laser beam transmitted through a ZnSe window (5 cm diameter) secured at the end of a stainless steel cell (e.g. $5\times 10$ cm.). The laser beam entering through the ZnSe window traversed a 10 cm path.

The fluoro compounds, $NF_3$ and $N_2F_4$, exhibit a series of very strong absorption bonds between 900–1050 $cm^{-1}$. Any resonant laser line with sufficient energy could be used to initiate the reaction.

Infrared laser excitation in the range of 10.4 or 9.4 $\mu m$ is provided by a Coherent Radiation Laboratories model 41 continuous-wave (cw) $CO_2$ laser. The exact laser frequencies are verified using an Optical Engineering $CO_2$ Spectrum Analyzer.

Experiments were performed on a masked silicon wafer. A mixture of NO and $NF_3$ in a ratio of 60 torr to 45 torr respectively was irradiated by 50 watts/$cm^2$ of the P(36) (929.02 $cm^{-1}$) $CO_2$ laser line. The irradiation time was 3 sec. The etching was repeated 3 times. A smooth etching of the exposed silicon was observed.

We claim:

1. A method for laser-induced production of gaseous nitrosyl fluoride for the continuous etching of a semiconductor silicon wafer by gaseous nitrosyl fluoride, said method comprising:
   (i) filling a laser reaction cell with a gaseous mixture of a catalyst compound of an oxide of nitrogen selected from the group of nitrogen oxide compounds consisting of NO, $N_2O$, and $NO_2$ and a fluoro compound selected from the group of fluoro compounds consisting of $NF_3$ and $N_2F_4$, said catalyst compound introduced into said laser reaction cell in a ratio of about 60 torr to about 45 torr of said fluoro compound,
   (ii) irradiating said gaseous mixture with a power level from about 25 to about 150 watts of a cw $CO_2$ tunable laser, tuned to a radiation line that is resonant with an absorption band of said fluoro compound, said irradiating being carried out for a predetermined time period based on a predetermined power level of said laser to thereby achieve a continuous production of gaseous nitrosyl fluoride,
   (iii) exposing a semiconductor silicon material to said gaseous nitrosyl fluoride to react said gaseous nitrosyl fluoride with the exposed semiconductor silicon material to achieve etching while producing $SiF_4$ and NO from said reacting; and,
   (iv) recovering said etched semiconductor silicon material, said $SiF_4$, and said NO.

2. The method as defined in claim 1 wherein said catalyst compound of an oxide of nitrogen is NO and wherein said fluoro compound is $NF_3$.

3. The method as defined in claim 2 wherein said nitrosyl fluoride is produced in situ is a combination reaction and etching chamber containing a plurality of semiconductor silicon material and wherein said recovered NO is recycled.

4. The method as defined in claim 1 wherein said catalyst compound of an oxide of nitrogen is $NO_2$ and wherein said fluoro compound is $NF_3$.

5. The method as defined in claim 4 wherein said nitrosyl fluoride is produced in a separate reaction chamber and allowed to flow into an etching chamber containing a plurality of semiconductor silicon material and wherein said recovered NO is recycled.

* * * * *